(12) United States Patent
Ogane

(10) Patent No.: US 6,407,598 B1
(45) Date of Patent: Jun. 18, 2002

(54) RESET PULSE SIGNAL GENERATING CIRCUIT

(75) Inventor: Junichi Ogane, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/708,022

(22) Filed: Nov. 8, 2000

(51) Int. Cl.[7] .................................................. H03L 7/00
(52) U.S. Cl. ........................ 327/143; 327/164; 327/198
(58) Field of Search ................................ 327/142, 143, 327/164, 198, 520, 534, 535, 537, 77–81, 162

(56) References Cited

U.S. PATENT DOCUMENTS

| | | | | | |
|---|---|---|---|---|---|
| 4,584,492 | A | * | 4/1986 | Sharp ............................ | 326/70 |
| 5,581,206 | A | * | 12/1996 | Chevalier et al. ............. | 327/143 |
| 5,654,656 | A | * | 8/1997 | Geannopoulos ............... | 327/143 |
| 5,686,848 | A | * | 11/1997 | Mes et al. ..................... | 327/143 |
| 5,877,652 | A | * | 3/1999 | Oh ................................ | 327/546 |
| 5,894,240 | A | * | 4/1999 | Shieh et al. .................. | 327/142 |
| 5,917,255 | A | * | 6/1999 | Ciccone ........................ | 307/130 |
| 6,141,764 | A | * | 10/2000 | Ezell ............................. | 713/340 |
| 6,198,318 | B1 | * | 3/2001 | Bhaskaran et al. ........... | 327/143 |

* cited by examiner

*Primary Examiner*—Kenneth B. Wells
*Assistant Examiner*—Hai L. Nguyen
(74) *Attorney, Agent, or Firm*—Volentine Francos, PLLC

(57) ABSTRACT

A reset pulse signal generating circuit includes an output node with an output circuit connected thereto that outputs the reset pulse signal, and a first MOS transistor having a first conductivity type connected between a first power supply and the output node. The first MOS transistor is turned on responsive to a write signal. The circuit further includes a second MOS transistor having a second conductivity type connected between the output node and a second power supply, and a power supply transition detector connected to the first and second power supplies and the second MOS transistor. The power supply transition detector outputs a transfer signal having a level determined by a level of the power supplies when the write signal is in an inactive state. The power supply transition detector outputs the transfer signal having a predetermined level when the write signal is in the active state.

26 Claims, 5 Drawing Sheets

F I G. 5
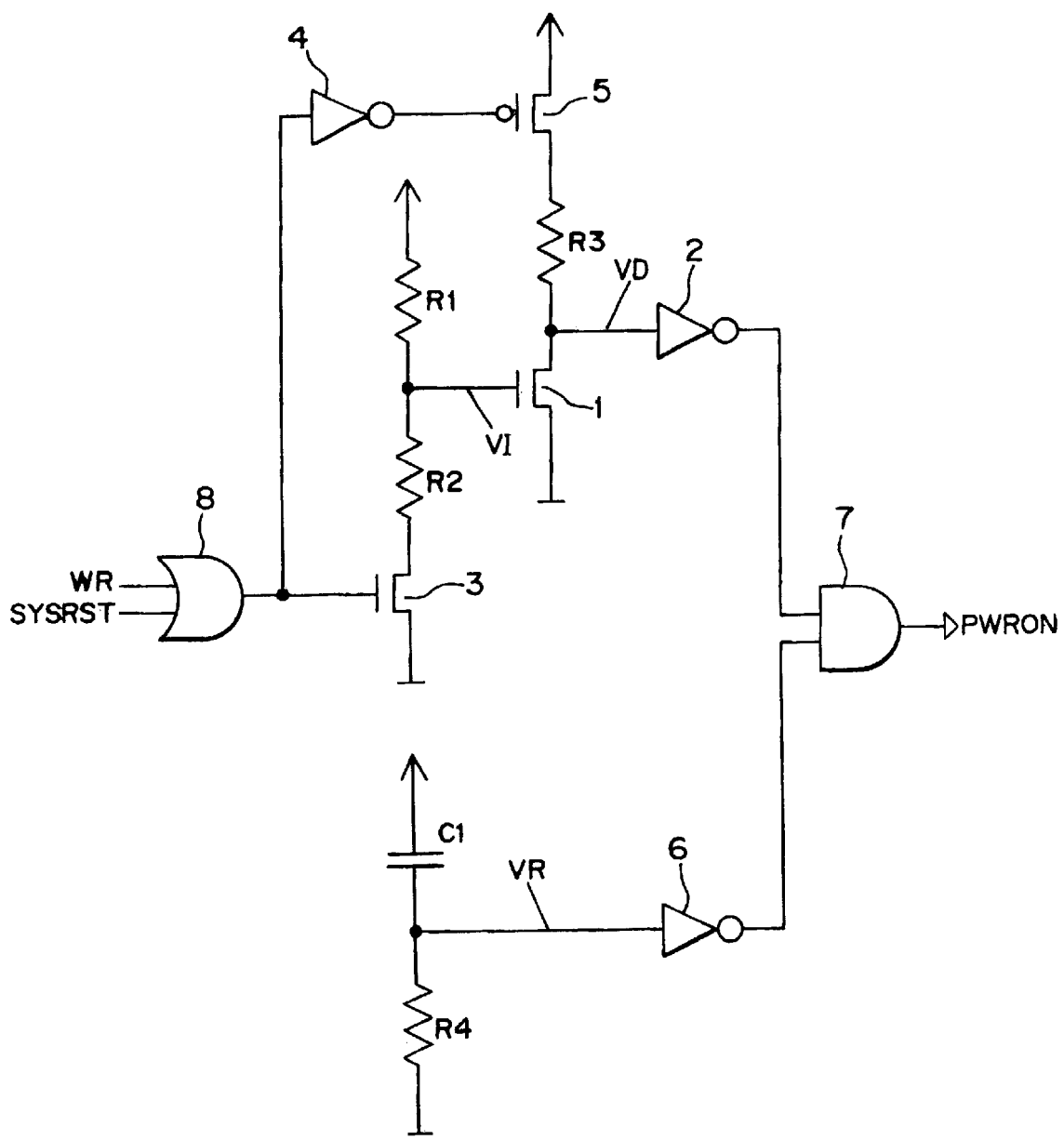

RESET PULSE SIGNAL GENERATING CIRCUIT

BACKGROUND OF THE INVENTION

The present invention relates to a reset pulse signal generating circuit, more specifically to a technique that prevents a write error caused by a sudden change of the power supply voltage or during the power being turned on.

When there occurs a sudden drop of the power supply voltage during a normal operating state or during an input of the power supply, the nonvolatile memory such as a flash memory can cause an unexpected delete of data, namely a write error. Especially, in a single supply voltage type flash memory, for example, all of the high voltages necessary for rewrite of data are generated in the chip of itself. Therefore, during an input of the power supply, or during an instant stop of the power supply, if the control circuit misidentifies it as a data rewrite command, the write error will surely be created.

In order to avoid this write error, a power supply level monitor circuit is effective.

The power supply level monitor circuit, including a direct current path, has a circuit that cuts off the direct current path during standby by means of a power-down signal added thereon In most cases.

However, during receiving the power-down signal, a cut-off of the direct current path will make the power supply level monitor circuit inoperative, whereby the rewrite control circuit cannot be initialized. Therefore, a complete prevention of the write error cannot be achieved, which is a problem to be solved.

SUMMARY OF THE INVENTION

With the foregoing in view, it is therefore an object of the present invention to provide a reset pulse generating circuit for preventing the write error of the semiconductor memory circuit.

A reset pulse signal generating circuit of the present invention comprises an output node and an output circuit connected to the output node and outputting the reset pulse signal and a first MOS transistor having a first conductivity type connected between a first power supply source and the output node. The first MOS transistor is turned on in response to the write signal. The reset pulse generating circuit further comprises a second MOS transistor having a second conductivity type connected between the output node and a second power supply source and a power supply transition detector connected to the first and second power supply sources and the second MOS transistor. The power supply transition detector outputs a transfer signal having a level which is determined by a level of the power supply sources when the write signal is in an inactive state. Further, the power supply transition detector outputs the transfer signal having a predetermined level when the write signal is In the active state.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

FIG. 5 illustrates a power supply monitor circuit of the third embodiment according to the invention;

DESCRIPTION OF THE PREFERRED EMBODIMENTS

Figure 1:
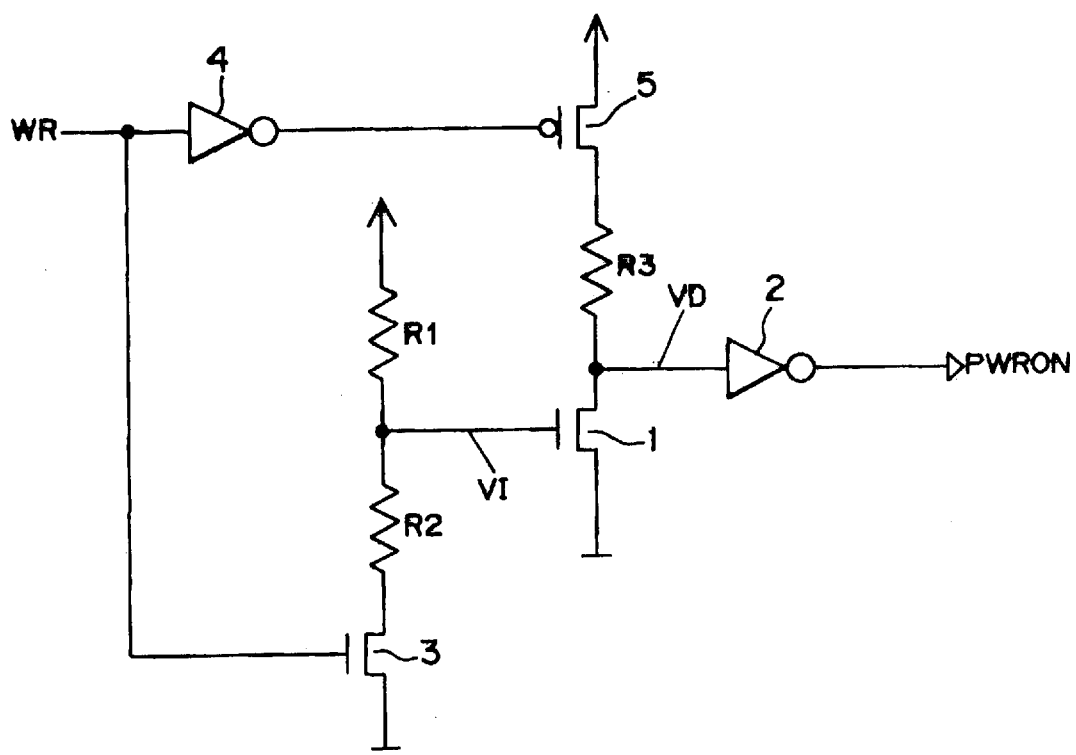
FIG. 1 illustrates a power supply monitor circuit of the first embodiment according to the invention.

FIG. 1 illustrates a power supply monitor circuit (a reset pulse signal generating circuit) of the first embodiment according to the present invention. The power supply monitor circuit is formed in a semiconductor memory circuit. In the drawing, the power supply voltage is divided by a resistor R1 and a resistor R2 into VI, which is supplied to the gate of an NMOS 1. The drain of the NMOS 1 is connected to one end of a resistor R3, the other end of which is connected to the drain of a PMOS 5, and the source of the PMOS 5 is connected to VCC. The resistor R1 is connected to a power supply source VCC, and the resistor R2 is connected to ground GND through an NMOS 3. A power supply transition detector includes the resistors R1 and R2 and the NMOS 3. The power supply transition detector outputs a signal VI whose level is determined by the resistors R1 and R2 when the write signal WR is in inactive state. The power supply transition detector outputs a low-level signal when the write signal is an active state. The write signal WR is In the active state when data are written in the semiconductor memory circuit. The write signal WR is connected to the gate of the NMOS 3, and the gate of the PMOS 5 is connected to a signal that an inverter 4 has inverted the write signal WR. The node VD located between the NMOS 1 and the resistor R3 is connected to the input of an inverter 2, and the output of the inverter 2 delivers a reset pulse signal PWRON.

Figure 2:
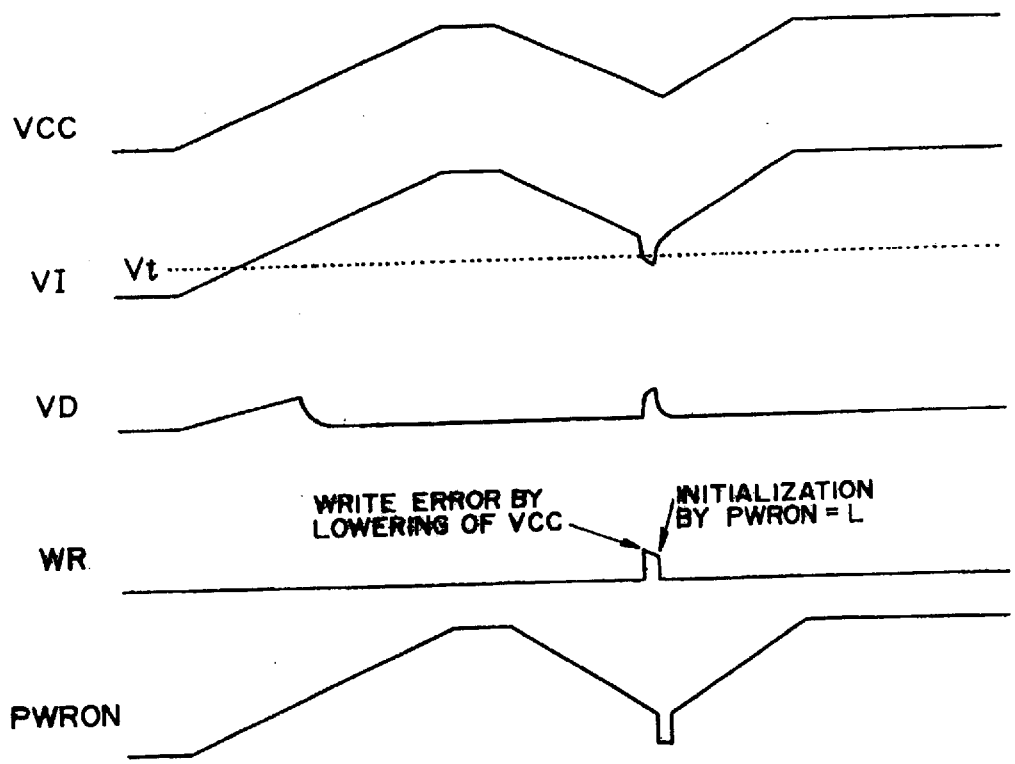
FIG. 2 illustrates an operation timing of FIG. 1.

FIG. 2 illustrates the operation timing of the first embodiment.

If the write signal WR is LOW, this circuit will not operate even during an input of the power supply or during an instant stop of the power supply. That is, VI is maintained at the VCC level, and VD is at the GND level.

Even though the circuit misjudges the current state as the write mode arid starts a write error, during an input of the power supply or during an instant stop of the power supply, since the signal WR has become HIGH, the circuit starts operation. If the power supply is in the midst of input, or during an instant drop, naturally the VCC level will be in decrease, and the signal PWRON transits the operational state as shown in FIG. 2.

As mentioned above, according to the power supply monitor circuit of the first embodiment, a power-down control or the like in the standby state is not required, and an effective prevention against a write error can be achieved while a current consumption during standby is reduced.

Figure 3:
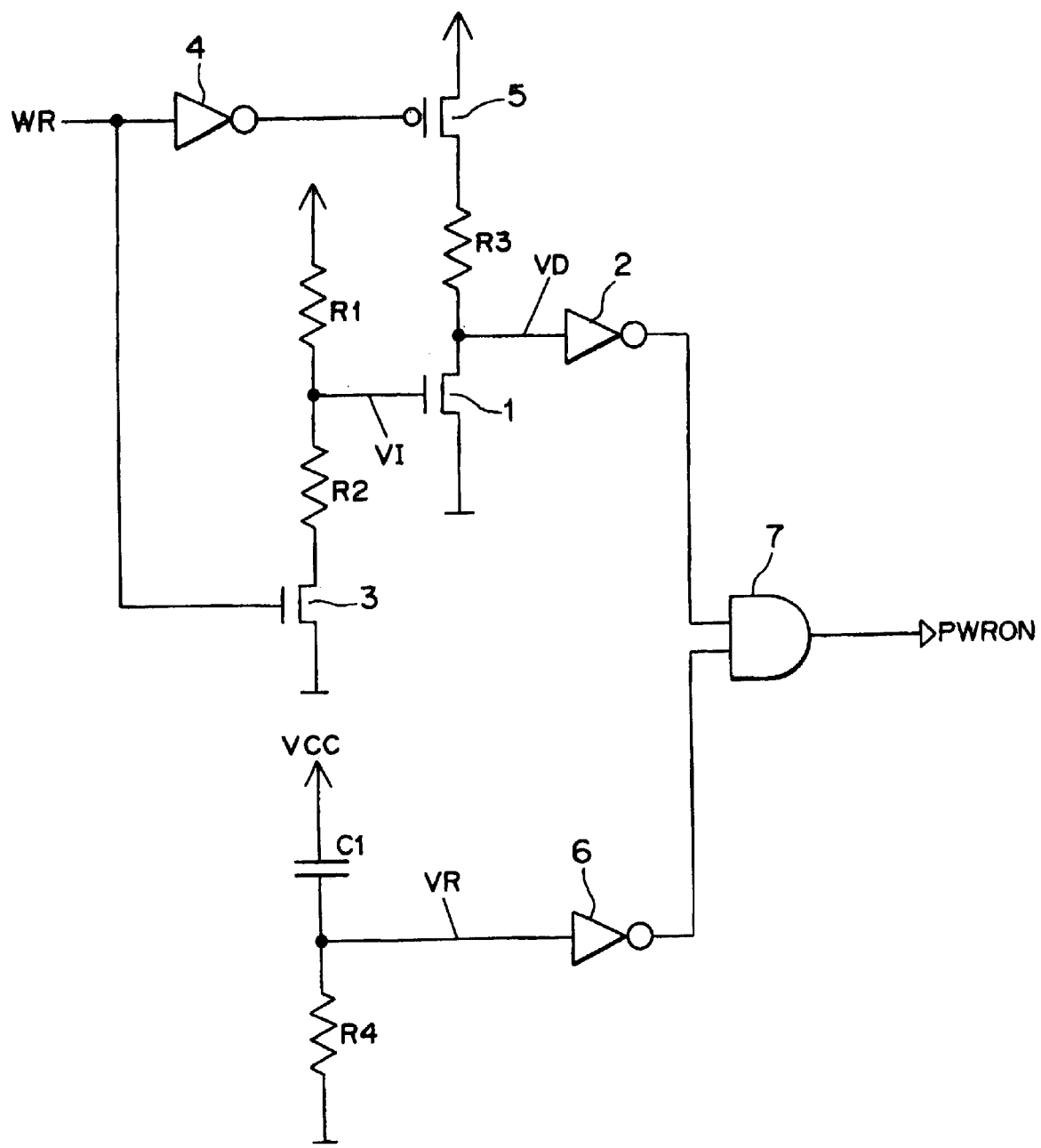
FIG. 3 illustrates a power supply monitor circuit of the second embodiment according to the invention.

FIG. 3 illustrates a power supply monitor circuit of the second embodiment according to the invention. In addition to the first embodiment, the second embodiment adds a circuit that generates a signal only during an input of the power supply.

In FIG. 3, the power supply monitor circuit composed of elements 1–5 and R1–R3 is the same as the one in the first embodiment.

In addition to those, a power on reset circuit including a capacitor C1 and a resistor R4 both of which are connected to the gate VR of an inverter 6 is provided in the second embodiment as show In FIG. 3. The power on reset circuit outputs a power on reset signal. The other end of the capacitor C1 is connected to VCC, and the other end of the resistor R4 is connected to GND.

The outputs of the inverter 2 and 6 are each connected to the inputs of an AND gate 7, and the output of the AND gate 7 supplies the PWRON signal.

Figure 4:
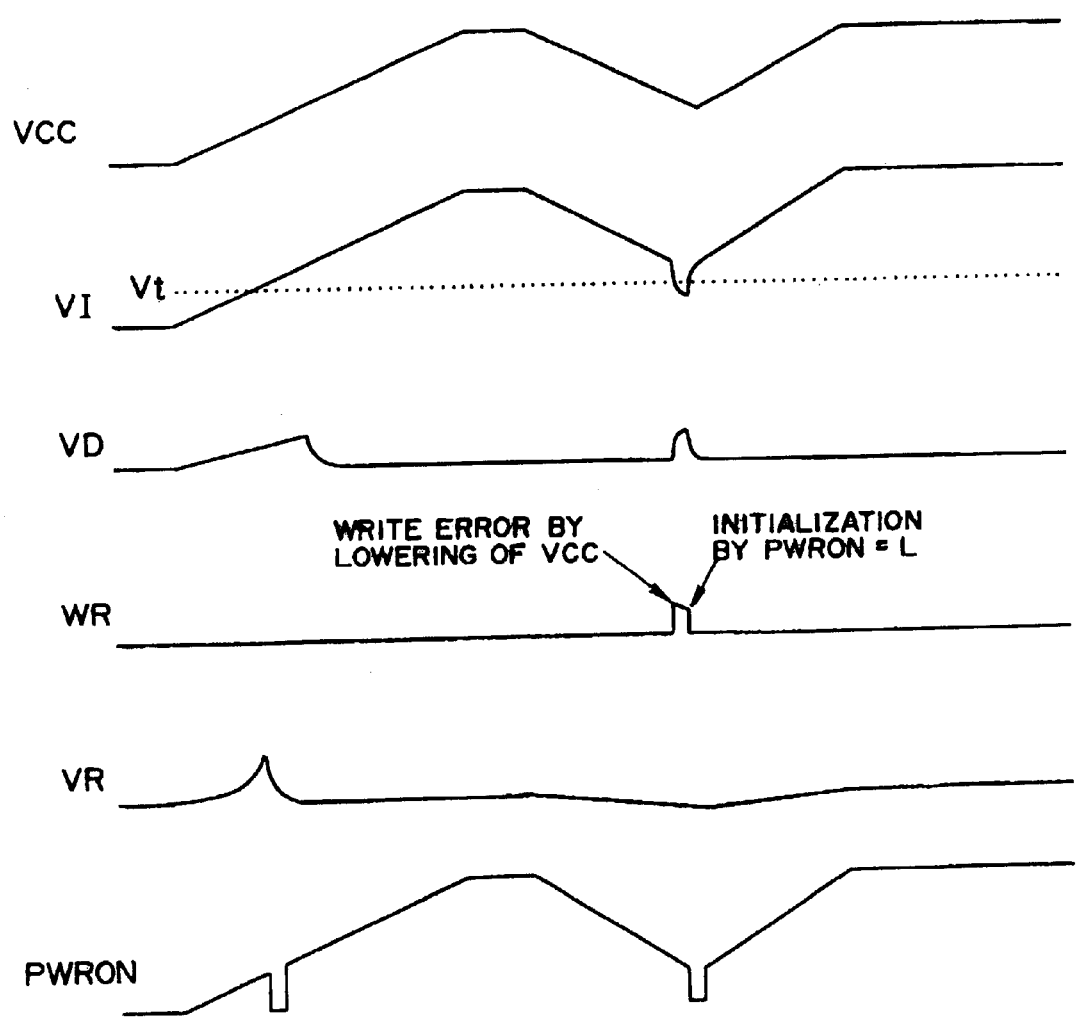
FIG. 4 illustrates an operation timing of FIG. 3.

FIG. 4 illustrates the operation of the second embodiment.

If there does not occur a write error during an input of the power supply, namely, if the write signal WR is LOW, the power supply monitor circuit composed of elements 1–5 and R1–R3 will not be operative, and the output of the inverter 2 will be maintained at HIGH. However, if the capacitance of the capacitor C1 and the resistance of the resistor R4 are set high, the gate VR will be given a differential waveform of VCC, which makes an instant peak, and in consequence the signal PWRON generates a LOW pulse.

When there occurs a write error during an input of the power supply or during an instant stop of the power supply, the operation is the same as one in WR=HIGH in the first embodiment.

As mentioned above, according to the configuration of the power supply monitor circuit and the power ON detection circuit of the second embodiment, in addition to the effect of the first embodiment that a power-down control or the like in the standby state is not required, and an effective prevention against a write error can be achieved while a current consumption during standby is reduced, a circuit other than the write control system can also be initialized securely by adding a circuit to generate a reset pulse, although there does not occur a write error during an input of the power supply.

FIG. 5 illustrates a power supply monitor circuit of the third embodiment according to the invention. In addition to the second embodiment, the third embodiment includes a system reset signal SYSRST inputted from the outside of the semiconductor memory circuit, which is added to the logic that activates the power supply monitor circuit. In FIG. 5, the activation signal of the power supply monitor circuit made up with elements 1–5 and R1–R3 is composed of the logical sum of the system reset signal SYSRST and the write signal WR by an OR gate 8, instead of the write signal WR only.

Figure 6:
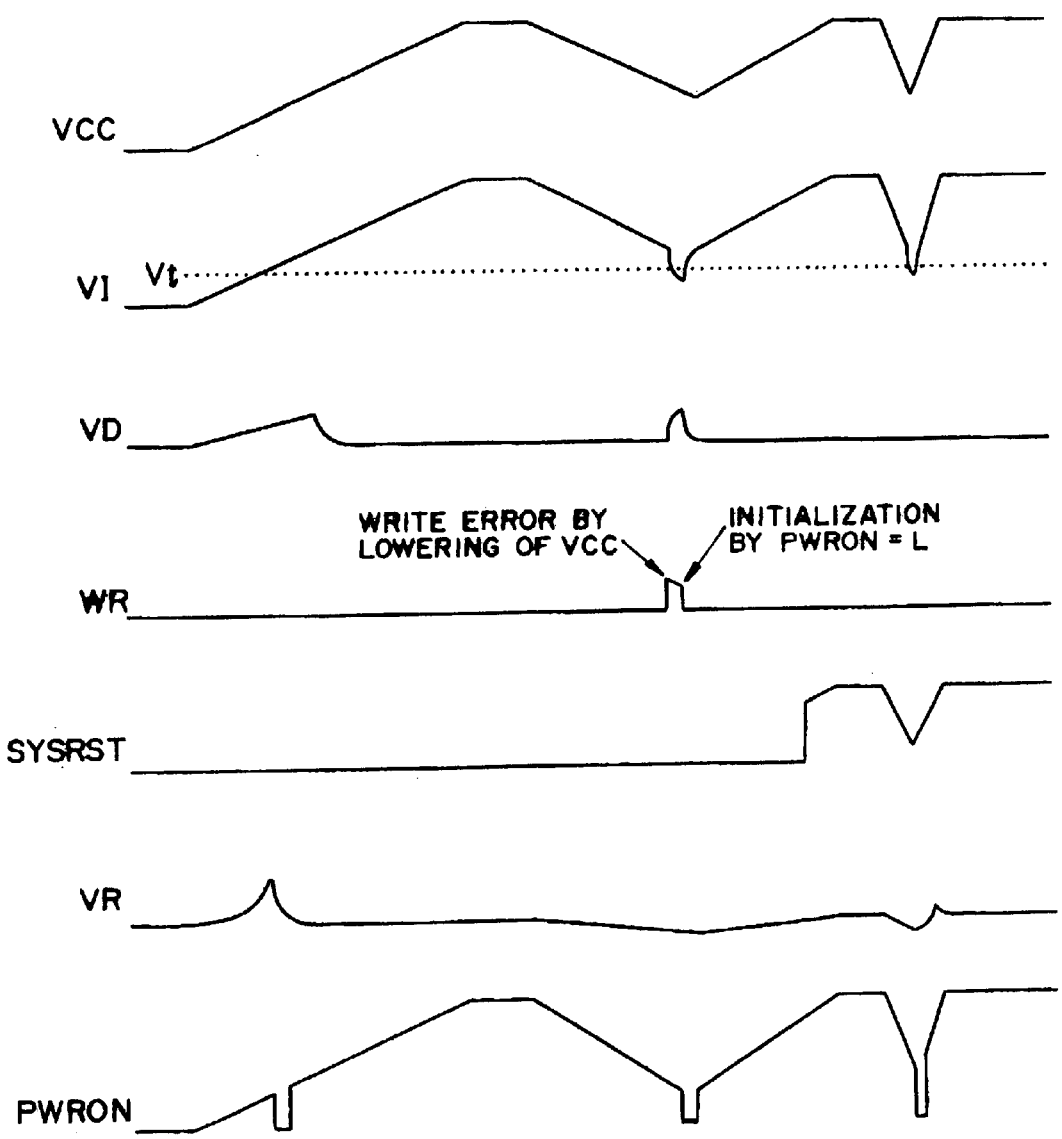
FIG. 6 illustrates an operation timing of FIG. 5.

FIG. 6 illustrates the operation of the third embodiment.

If there does not occur a write error during an input of the power supply, namely, if the write signal WR is LOW, the power supply monitor circuit composed of elements 1–5 and R1–R3 will not be operative, and the output of the inverter 5 will be maintained at HIGH. However, the differential waveform generated by the capacitor C1 and the resistor R4 produces a LOW pulse to PWRON, which is the same as in the second embodiment.

When there occurs a write error during an input of the power supply or during an instant stop of the power supply, the operation is the same as one in WR=HIGH in the first embodiment.

When the period of the power supply being cut off is extremely short, it is conceivable that the capacitor C1 brings the gate VR into a level lower than GND and the gate VR is not initialized completely to the GND level. In such a case, the differential waveform appearing on the gate VR after a re-input of the power supply is an incomplete one such that the inverter 6 cannot recognize it as the HIGH level under many circumstances. In this embodiment, since the system reset signal SYSRST from the outside of the chip operates the power supply monitor circuit, the signal PWRON can securely be generated.

As mentioned above, according to the configuration of the power supply monitor circuit and the power ON detection circuit and in addition the activation circuit of the power supply monitor circuit by the external reset signal, in addition to the effect of the first and second embodiments that a power-down control or the like in the standby state is not required, and an effective prevention against a write error can be achieved while a current consumption during standby Is reduced, the Initialization signal can securely be generated by the reset operation of the external reset signal. Thereby, in a flash memory mounted on a micro-controller, for example, a reset signal produced during an input of the power supply or during the power supply being turn on from off operates the power supply monitor circuit and securely generates the initialization signal.

Further, in case the external reset signal is inputted when the power supply is in the ON state, although the power supply monitor circuit is activated, since the power supply is in the ON state, the initialization signal is not generated in the circuit configuration of this embodiment. That is, since the circuit operates on the very necessary occasion, namely, only during an input of the power supply or during an instant stop of the power supply, it becomes unnecessary to make the CPU side perform a waiting operation directly after the external reset, for example.

Further, the circuit configuration for the power supply monitoring and the circuit configuration for detecting the power ON are not limited to this embodiment.

Furthermore, the third embodiment includes the three elements, namely, the power supply monitor circuit, the circuit that detects only the power ON, and the addition of the activation element of the power supply monitor circuit; however, combinations of these elements will not be confined to the third embodiment.

What is claimed is:

1. A reset pulse signal generating circuit formed in a semiconductor memory circuit in which data are written during when a write signal is in an active state, the reset pulse signal generating circuit comprising:

an output node;

an output circuit having an input connected to said output node and an output for outputting a reset pulse signal in response to a level on the input thereof:

a first MOS transistor having a first conductivity type connected between a first power supply source and said output node, said first MOS transistor being turned on in response to the write signal being in the active state;

a second MOS transistor having a second conductivity type that is opposite to the first conductivity type, said second MOS transistor is connected between said output node and a second power supply source; and a power supply transition detector connected to the first and second power supply sources and said second MOS transistor, said power supply transition detector outputting a transfer signal having a level which is determined by a level of the first and second power supply sources when the write signal is in the active state, said power supply transition detector outputting the transfer signal having a predetermined level when the write signal is in an inactive state.

2. A reset pulse signal generating circuit according to claim 1, wherein said second MOS transistor turns on in response to the transfer signal having the predetermined level.

3. A reset pulse signal generating circuit according to claim 1, wherein said power supply transition detector includes, an output terminal for outputting the transfer signal, a first resistor connected between the first power supply source and said output terminal, a second resistor; and a third MOS transistor having the second conductivity type, said second resistor and said third MOS transistor are connected in series between said output terminal and the second power supply source, said third MOS transistor being turned on in response to the write signal having the active state.

4. A reset pulse signal generating circuit according to claim 1, wherein said output circuit is a first inverter.

5. A reset pulse signal generating circuit according to claim 1, wherein the first MOS transistor is a PMOS transistor and the second MOS transistor is an NMOS transistor.

6. A reset pulse signal generating circuit according to claim 1, further comprising an inverter having an input receiving the write signal and an output connected to the first MOS transistor.

7. A reset pulse signal generating circuit according to claim 1, further comprising a resistor connected between said first MOS transistor and said output node.

8. A reset pulse signal generating circuit formed in a semiconductor memory circuit in which data are written during when a write signal is in an active state, the reset pulse signal generating circuit comprising:

a first node;

a first circuit having an input connected to said first node and an output for outputting an internal reset signal in response to a level on the input thereof;

a first MOS transistor having a first conductivity type connected between a first power supply source and said first node, said first MOS transistor being turned on in response to the write signal being in the active state;

a second MOS transistor having a second conductivity type that is opposite to the first conductivity type, said second MOS transistor is connected between said first node and a second power supply source;

a power supply transition detector connected to the first and second power supply sources and said second MOS transistor, said power supply transition detector outputting a transfer signal having a level which is determined by a level of the first and second power supply sources when the write signal is in the active state, said power supply transition detector outputting the transfer signal having a predetermined level when the write signal is in an inactive state;

a power on reset circuit generating a power on reset signal; and a gate circuit receiving the internal reset signal and the power on reset signal and outputting a reset pulse signal in response to the internal reset signal and the power on reset signal.

9. A reset pulse signal generating circuit according to claim 8, wherein said second MOS transistor turns on in response to the transfer signal having the predetermined level.

10. A reset pulse signal generating circuit according to claim 8, wherein said power supply transition detector includes, an output terminal for outputting the transfer signal, a first resistor connected between the first power supply source and said output terminal, a second resistor; and a third MOS transistor having the second conductivity type, said second resistor and said third MOS transistor are connected in series between said output terminal and the second power supply source, said third MOS transistor being turned on in response to the write signal having the active state.

11. A reset pulse signal generating circuit according to claim 8, wherein said first circuit is a first inverter.

12. A reset pulse signal generating circuit according to claim 8, wherein the first MOS transistor is a PMOS transistor and the second MOS transistor is an NMOS transistor.

13. A reset pulse signal generating circuit according to claim 8, further comprising an inverter having an input receiving the write signal and an output connected to the first MOS transistor.

14. A reset pulse signal generating circuit according to claim 8, further comprising a resistor connected between said first MOS transistor and said first node.

15. A reset pulse signal generating circuit according to claim 8, wherein said gate circuit is an AND circuit.

16. A reset pulse signal generating circuit according to claim 8, wherein said power on reset circuit includes a capacitor connected to the first power supply source, a resistor connected between said capacitor and the second power supply source and an inverter having an input connected to said capacitor and said resistor and an output for outputting the power on reset signal.

17. A reset pulse signal generating circuit formed in a semiconductor memory circuit in which data are written during when a write signal is in an active state, the semiconductor memory circuit being reset in response to a system reset signal, the reset pulse signal generating circuit comprising:

a first node;

a first circuit having an input connected to said first node and an output for outputting an internal reset signal in response to a level on the input thereof;

a second circuit receiving the write signal and the system reset signal and outputting an internal write signal in response to the write signal and the system reset signal;

a first MOS transistor having a first conductivity type connected between a first power supply source and said first node, said first MOS transistor being turned on in response to the internal write signal being in an active state;

a second MOS transistor having a second conductivity type that is opposite to the first conductivity type, said second MOS transistor is connected between said first node and a second power supply source;

a power supply transition detector connected to the first and second power supply sources and said second MOS transistor, said power supply transition detector outputting a transfer signal having a level which is determined by a level of the first and second power supply sources when the internal write signal is in the active state, said power supply transition detector outputting the transfer signal having a predetermined level when the internal write signal is in an inactive state;

a power on reset circuit generating a power on reset signal; and a gate circuit receiving the internal reset signal and the power on reset signal and outputting a reset pulse signal in response to the internal reset signal and the power on reset signal.

18. A reset pulse signal generating circuit according to claim 17, wherein said second MOS transistor turns on in response to the transfer signal having the predetermined level.

19. A reset pulse signal generating circuit according to claim 17, wherein said power supply transition detector includes, an output terminal for outputting the transfer signal, a first resistor connected between the first power supply source and said output terminal, a second resistor; and a third MOS transistor having the second conductivity type, said second resistor and said third MOS transistor are connected in series between said output terminal and the second power supply source, said third MOS transistor being turned on in response to the write signal having the active state.

20. A reset pulse signal generating circuit according to claim 17, wherein said first circuit is a first inverter.

21. A reset pulse signal generating circuit according to claim 17, wherein the first MOS transistor is a PMOS transistor and the second MOS transistor is an NMOS transistor.

22. A reset pulse signal generating circuit according to claim 17, further comprising an inverter having an input receiving the internal write signal and an output connected to the first MOS transistor.

23. A reset pulse signal generating circuit according to claim 17, further comprising a resistor connected between said first MOS transistor and said first node.

24. A reset pulse signal generating circuit according to claim 17, wherein said gate circuit is an AND circuit.

25. A reset pulse signal generating circuit according to claim 17, wherein said second circuit is an OR circuit.

26. A reset pulse signal generating circuit according to claim 17, wherein said power on reset circuit includes a capacitor connected to the first power supply source, a resistor connected between said capacitor and the second power supply source and an inverter having an input connected to said capacitor and said resistor and an output for outputting the power on reset signal.

* * * * *